(12) United States Patent
Ciuffoli (10) Patent No.: US 7,368,934 B2
(45) Date of Patent: May 6, 2008

(54) AVALANCHE TESTING AT FINAL TEST OF TOP AND BOTTOM FETS OF A BUCK CONVERTER

(75) Inventor: Andrea Ciuffoli, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 4 days.

(21) Appl. No.: 11/342,893

(22) Filed: Jan. 30, 2006

(65) Prior Publication Data

US 2006/0170443 A1    Aug. 3, 2006

Related U.S. Application Data

(60) Provisional application No. 60/647,986, filed on Jan. 28, 2005.

(51) Int. Cl.
*G01R 31/26* (2006.01)

(52) U.S. Cl. ........................ 324/765; 324/110

(58) Field of Classification Search ..................... None
See application file for complete search history.

(56) References Cited

U.S. PATENT DOCUMENTS

| | | | | |
|---|---|---|---|---|
| 4,754,385 A | * | 6/1988 | McDade et al. | 363/16 |
| 5,097,196 A | * | 3/1992 | Schoneman | 323/222 |
| 5,408,150 A | * | 4/1995 | Wilcox | 327/108 |
| 5,480,150 A | * | 1/1996 | Weyand | 273/138.1 |
| 6,175,225 B1 | * | 1/2001 | De Groot | 323/282 |
| 6,204,648 B1 | * | 3/2001 | Saeki et al. | 323/282 |
| 6,504,351 B2 | * | 1/2003 | Eagar et al. | 323/282 |
| 7,202,643 B2 | * | 4/2007 | Miftakhutdinov | 323/224 |
| 2006/0232252 A1 | * | 10/2006 | Walters | 323/222 |

OTHER PUBLICATIONS

"iPOWIR Building Blocks for Multiphase Buck Converters," www.irf.com.
"iP1203, iPOWIR Building Block for Single Phase Buck Converters," www.irf.com.
"iP1201 and iP1202: Single/Dual Output Full Function 2-Phase DC-DC Converter Synchronous Buck Power Blocks," www.irf.com.
"Known Good Die—The SureCHIP Process," www.irf.com.
McDonald, T., et al., "Power MOSFET Avalanche Design Guidelines," www.irf.com, Application Note AN-1005, pp. 1-17.

* cited by examiner

*Primary Examiner*—Ha Tran Nguyen
*Assistant Examiner*—Richard Isla-Rodas
(74) *Attorney, Agent, or Firm*—Ostrolenk, Faber, Gerb & Soffen, LLP (57) ABSTRACT

An avalanche test circuit for applying an avalanche test signal to a device under test, comprising a series combination of a voltage source and an inductance; a switching device connected in parallel with said series combination; a diode for being connected to a test terminal of said device under test, said diode being connected to a connection point of said inductance and said switching device; a common terminal of said device under test being connected to a connection point of said switching device and said voltage source.

9 Claims, 9 Drawing Sheets

FIG. 9 PRIOR ART
Decoupled V$_{DD}$ Voltage Source
Test Circuit Model

FIG. 10 PRIOR ART
Decoupled V$_{DD}$ Voltage Source
Test Circuit Waveforms

FIG. 11 PRIOR ART
Typical Simulated Avalanche
Waveforms

FIG. 12 PRIOR ART
IRFP450 (500V Rated) Device
Avalanche Waveforms

FIG. 13

AVALANCHE TESTING AT FINAL TEST OF TOP AND BOTTOM FETS OF A BUCK CONVERTER

CROSS-REFERENCE TO RELATED APPLICATION

This application is based upon and claims priority of U.S. Provisional Ser. No. 60/647,986 filed Jan. 28, 2005, incorporated by reference.

BACKGROUND OF THE INVENTION

1. Field of the Invention

A method and device for avalanche testing of top and bottom FETs of a DC to DC buck converter.

2. Background Art

In the last few years it has become very critical to screen defective devices before the final assembly of a module in order to reduce cost.

Known Good Die (KGD) test systems using probes and/or pogo pin contacts are available to guarantee that only good dies will be assembled in the final module, although these systems can be expensive.

However, a critical test that is difficult to implement using a probe is the avalanche test. All semiconductor devices are rated for a certain maximum reverse voltage (BVdss for power MOSFETs). Operation above this threshold will cause high electric fields in reverse-biased p-n junctions. Due to impact ionization, these fields create electron-hole pairs that undergo a multiplication (avalanche) effect leading to increasing current. This reverse current flow causes large power dissipation and temperature rise, and potentially may cause the destruction of the device. However, the KGD system is capable of avalanche testing only up to 80 A of peak current for a 157 mils×50 mils die.

Due to the introduction of low cost packages it has quite often become convenient to go to production with the die not tested by the KGD system but tested for avalanche at final test, once the die are already in the package. Although convenient, this technique may lead to higher costs due to defective packages.

Figure 1:
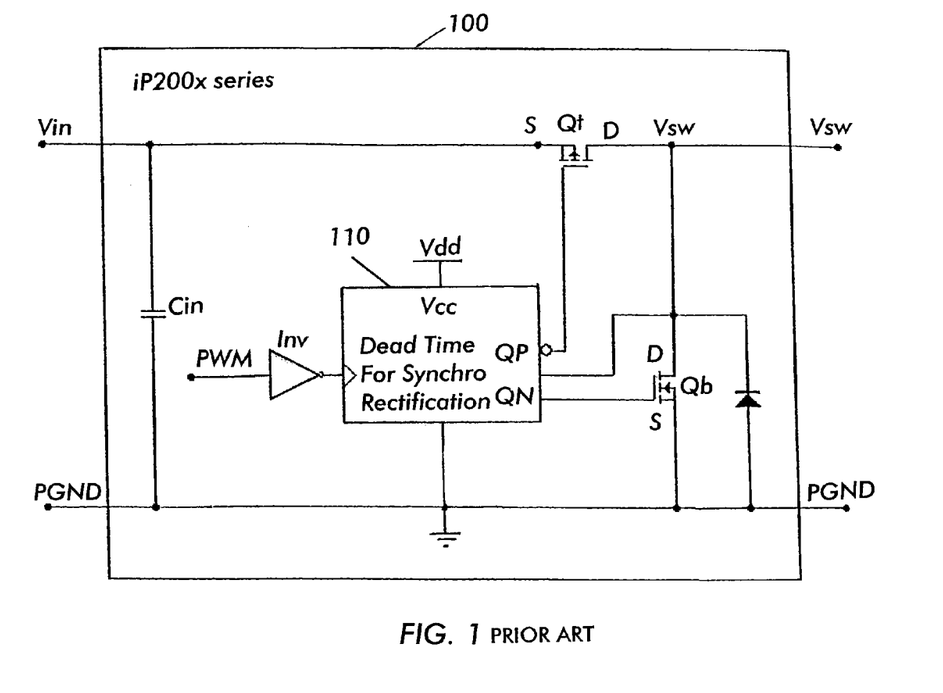
FIG. 1 is a schematic diagram of a known module for a first DC-DC buck converter.

FIG. 1 shows the typical schematic of a module 100 including an IC 110 for a single-phase synchronous DC-DC buck converter such as a converter of the iP200x Series manufactured by International Rectifier Corp. and described in more detail at www.irf.com, incorporated by reference.

Figure 2:
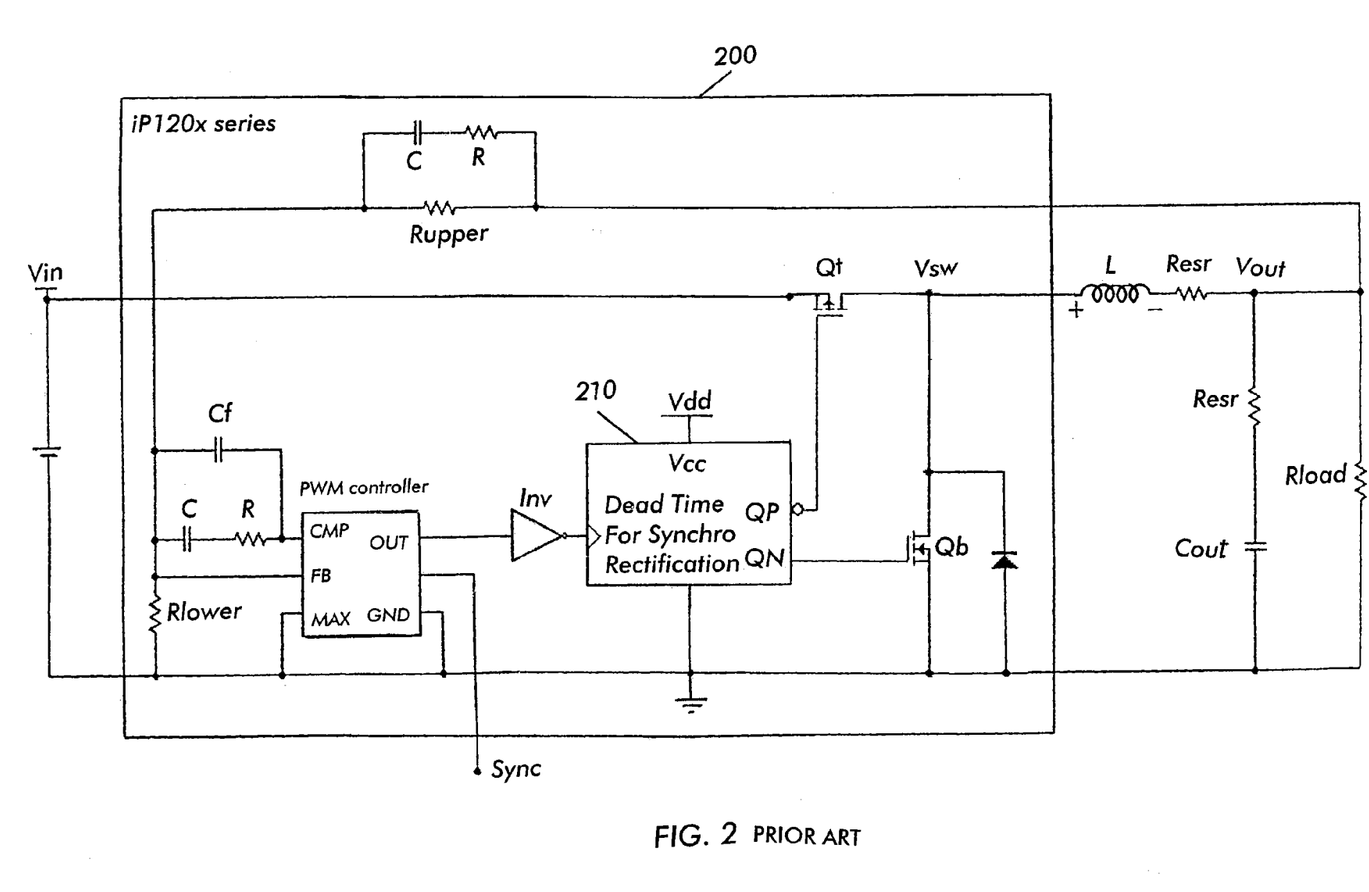
FIG. 2 is a schematic diagram showing a module and additional components of a second DC-DC buck converter.

FIG. 2 shows the typical schematic including a module 200 and an IC 210 for a fully functional multi-phase synchronous DC-DC buck converter, such as a converter of the iP120x Series manufactured by International Rectifier Corp. and described in more detail at www.irf.com, incorporated by reference.

At final test it is possible to test the power loss of each single module built. A typical application circuit is implemented in the load board.

With a series of relays we are able to disconnect the input circuit, the output circuit and all the power supplies. The DRAIN and SOURCE for both the top and the bottom FETs are available for testing.

Figure 9:
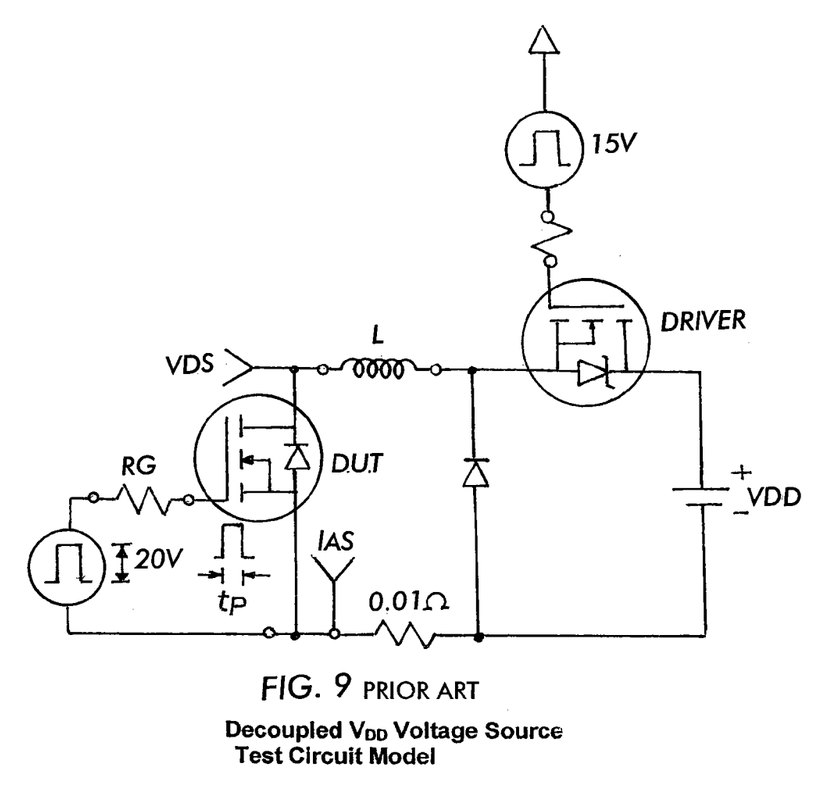
FIG. 9 is a schematic diagram showing a decoupled $V_{DD}$ voltage source test circuit.
Figure 10:
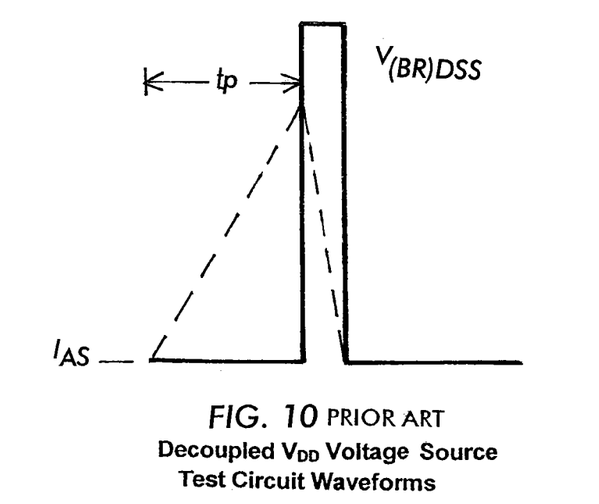
FIGS. 10-12 are waveforms illustrating avalanche testing with the circuit of FIG. 9.

A decoupled $V_{DD}$ voltage source has been used for avalanche testing, as illustrated in FIGS. 9 and 10. Here a driver FET and recirculation diode are added so that the voltage drop across the inductor during avalanche is equal to the avalanche voltage. With this circuit the energy can be approximated as:

$$E_{AS} = \frac{1}{2} L \cdot I_{AS}^2$$

Figure 11:
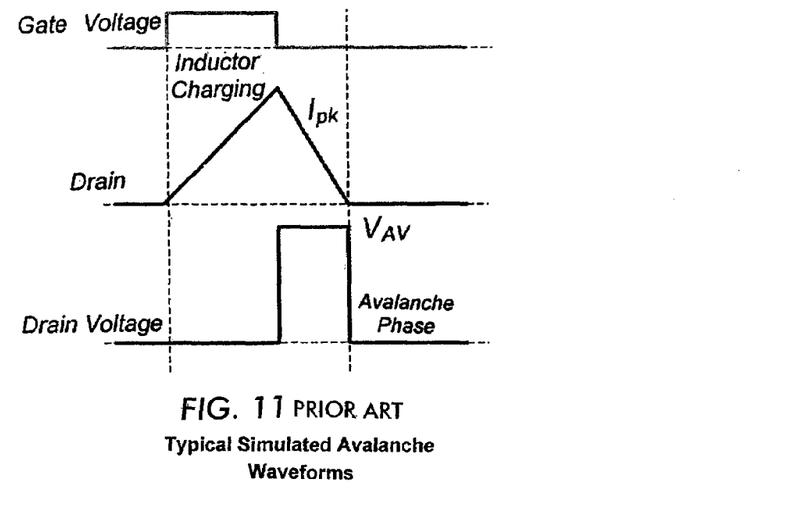
Figure 12:
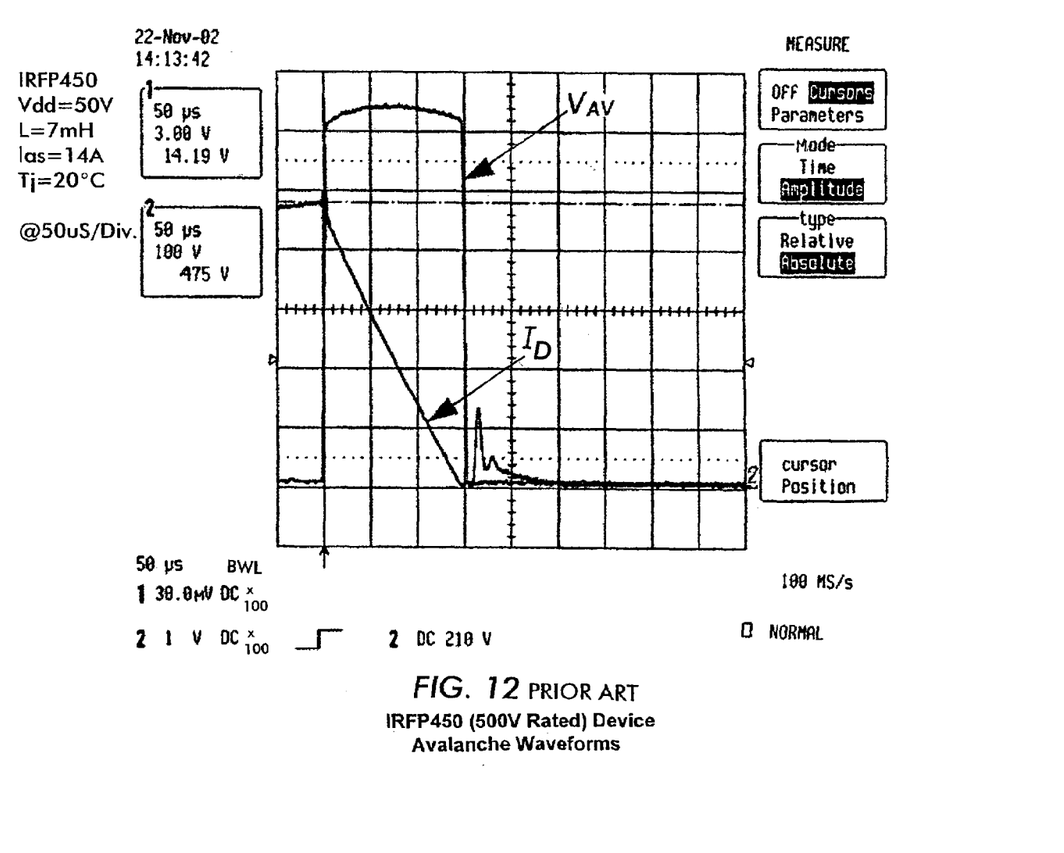

For further reference, FIGS. 11 and 12 depict ideal and actual avalanche waveforms, respectively. Note that the peak avalanche voltage $V_{AV}$ can be approximated as 1.3 times the device rating, or 650V. Further note that $V_{(BR)DSS}$, BVdss and $V_{AV}$ are used interchangeably.

The following issues are presented by the buck converter of FIG. 1:

The GATEs of both top and bottom FETs Qt, Qb are not accessible for testing

The input cap Cin is part of the avalanche circuit

When we test avalanche on the bottom FET Qb, the SOURCE voltage of the top FET Qt rises up to BVdss and can damage the GATE of the top FET Qt which may be only 20V rated. Also, the IC 110 is not rated up to the BVdss of the bottom FET Qb.

Additional issues are presented by the buck converter of FIG. 2:

The IC input 210 is not rated up to BVdss of the top FET Qt.

The only way to shut down the bottom FET Qb and turn on the top FET Qt is to switch the IC 210.

SUMMARY OF THE INVENTION

A first aspect of the invention is a solution that has been found for the single-phase open loop DC-DC buck converter exemplified by the circuit of FIG. 1.

A second aspect of the invention is a solution that has been found for the fully functional multi-phase DC-DC buck converter exemplified by FIG. 2.

These solutions are capable of reaching peak avalanche currents of 180 A for both the top and the bottom FETs with an inductor of 10 pH.

Other features and advantages of the present invention will become apparent from the following description of embodiments of the invention which refers to the accompanying drawings.

DETAILED DESCRIPTION OF EMBODIMENTS OF THE INVENTION

Figure 3:
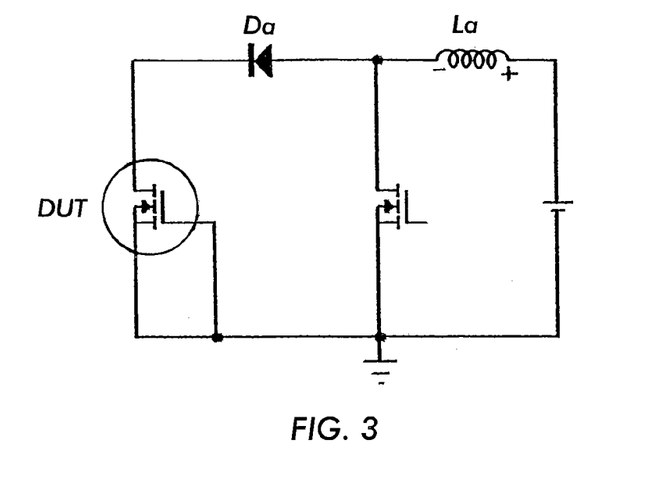
FIG. 3 is a schematic diagram showing an avalanche test circuit.
Figure 4:
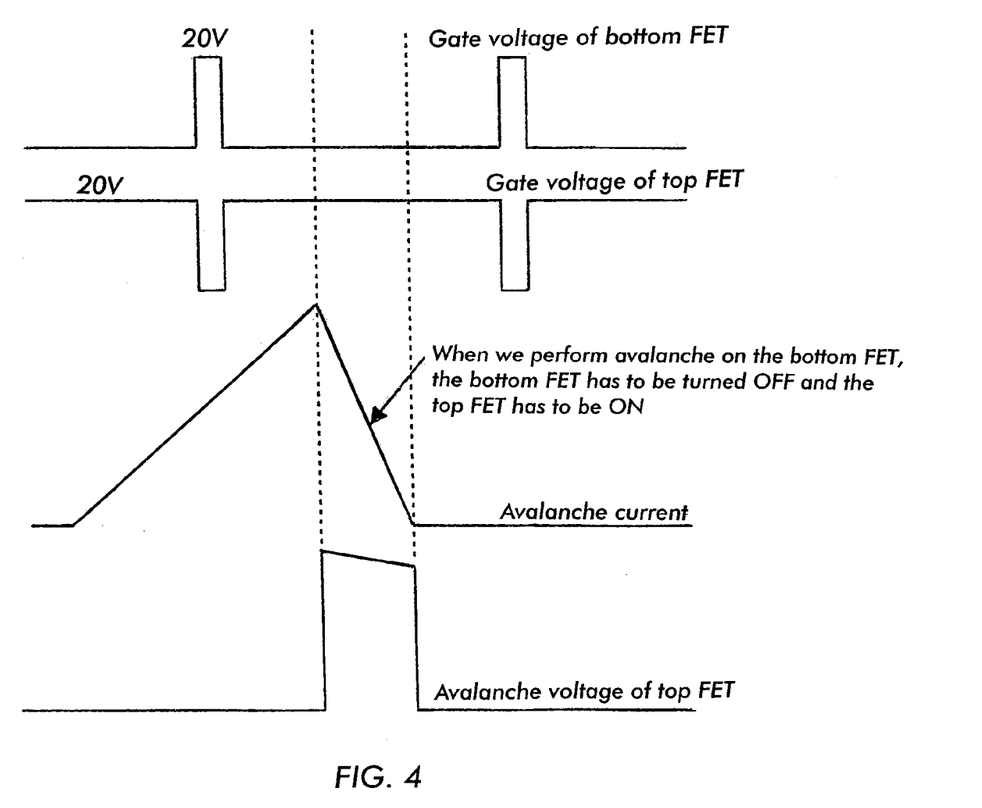
FIGS. 4-8 are waveforms illustrating avalanche testing.
Figure 5:
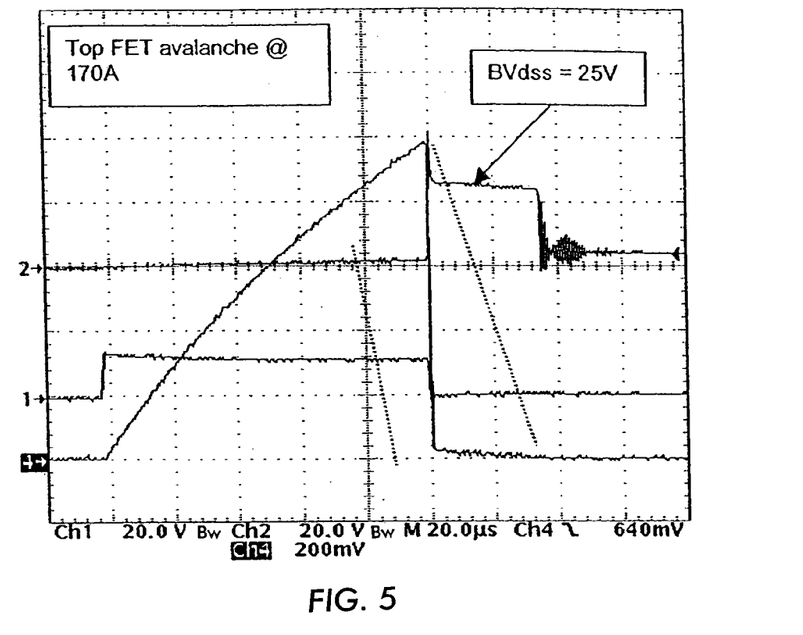
Figure 6:
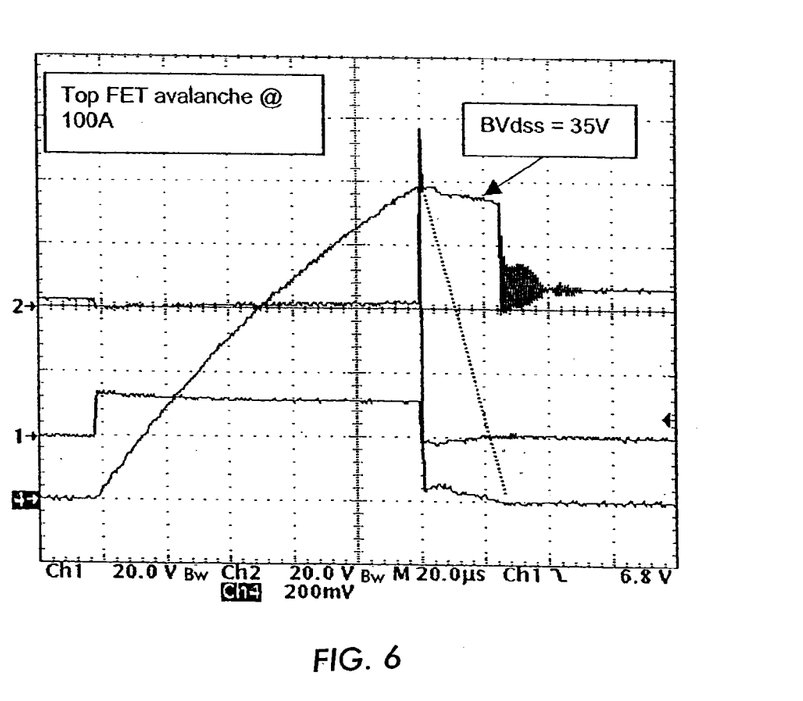
Figure 7:
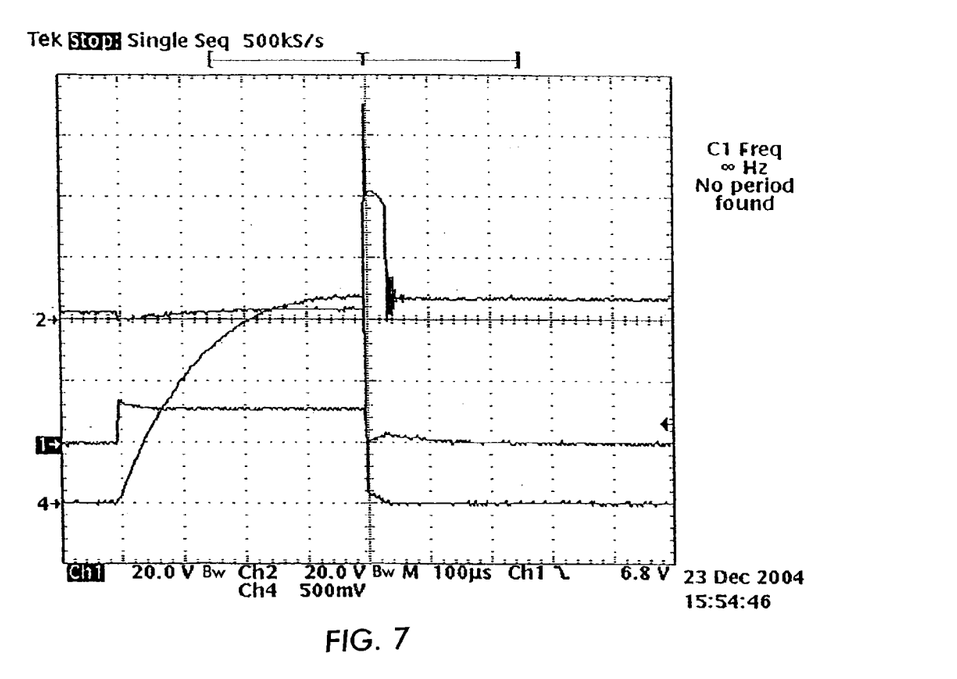
Figure 8:
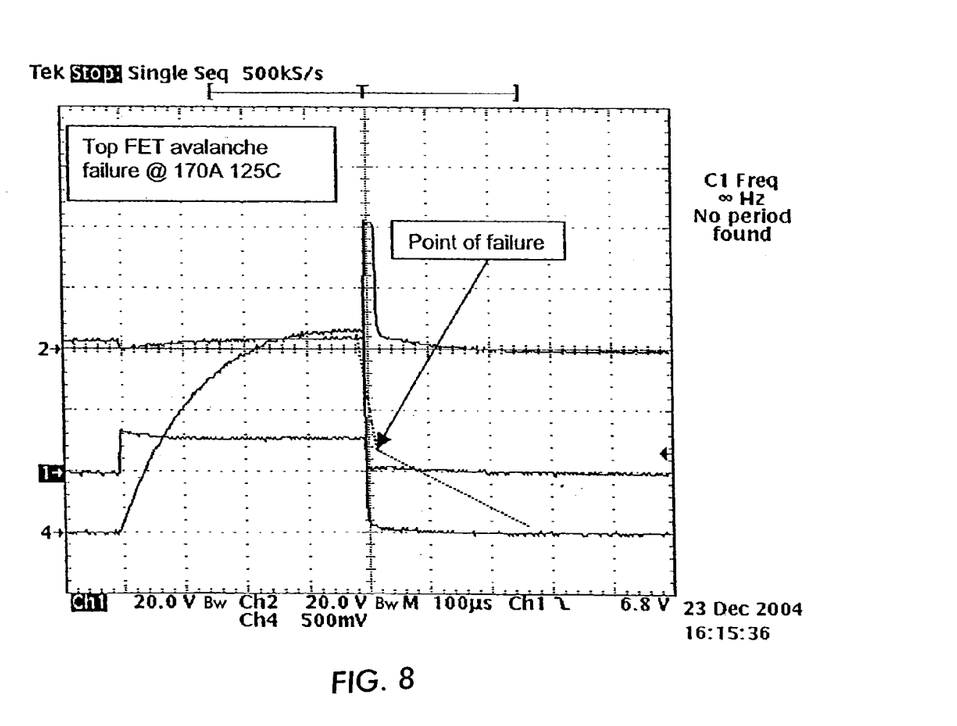

The first issue has been resolved by the test circuit shown in FIG. 3 having an external FET to charge the current on the avalanche inductor La.

The second issue has been resolved by pre-charging the input cap Cin to the BVdss of the top FET Qt. Also a diode Da is used in the avalanche circuit (FIG. 3) to avoid the cap Cin being discharged.

Figure 1A:
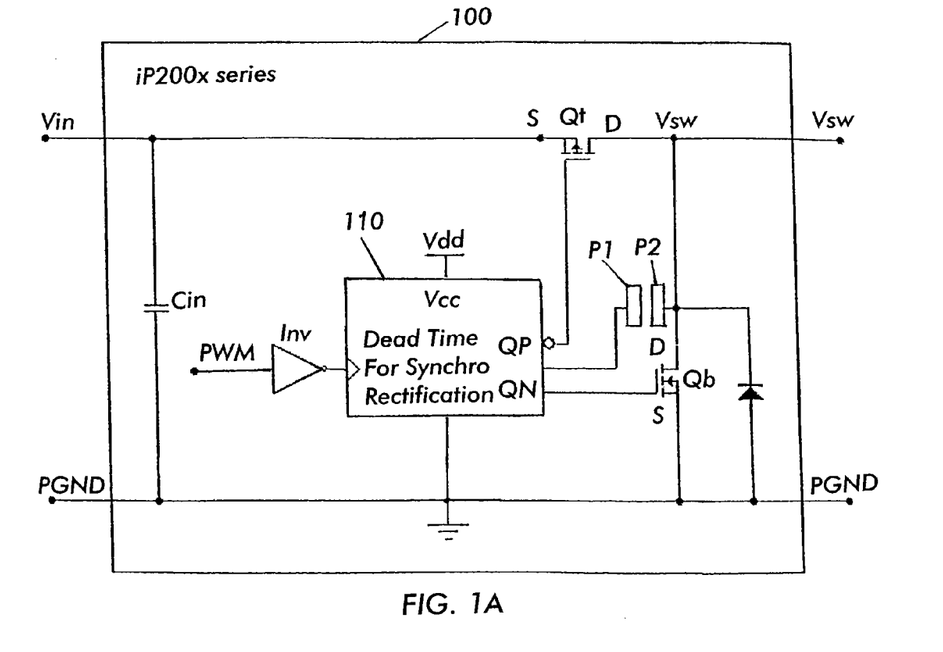
FIG. 1A shows the module of FIG. 1, modified according to an embodiment of the invention.

The third issue has been resolved by splitting the internal pad (not shown) connecting the switch node Vsw to the IC 110, forming pads P1 and P2. See FIG. 1A. In this way the IC 110 doesn't see the high voltage applied to the bottom FET Qb. Also we supply 20V on the switch node Vsw which brings the gate of the top FET up to 20V and we can run avalanche testing on bottom FET Qb assuming that the BVdss is lower than 40V. The two pads P1, P2 are shown schematically and need not be located at any specific part of the module 100. They are externally accessible. When installed in a complete converter circuit, the pads P1, P2 are connected together, for example by being bridged by a single pad on the circuit board, or by another type of connection.

Figure 2A:
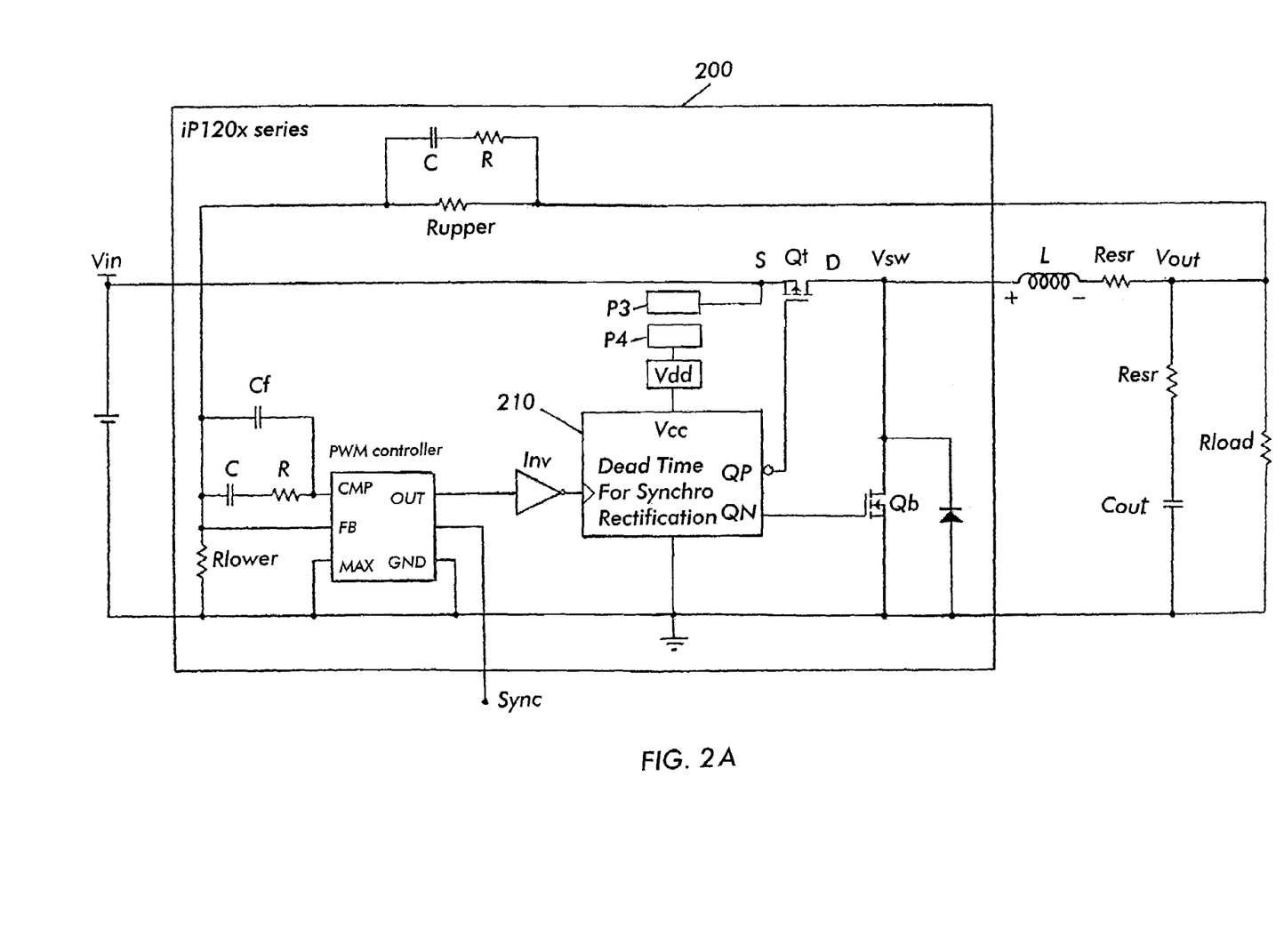
FIG. 2A shows the converter of FIG. 2, modified according to an embodiment of the invention.
Figure 13:
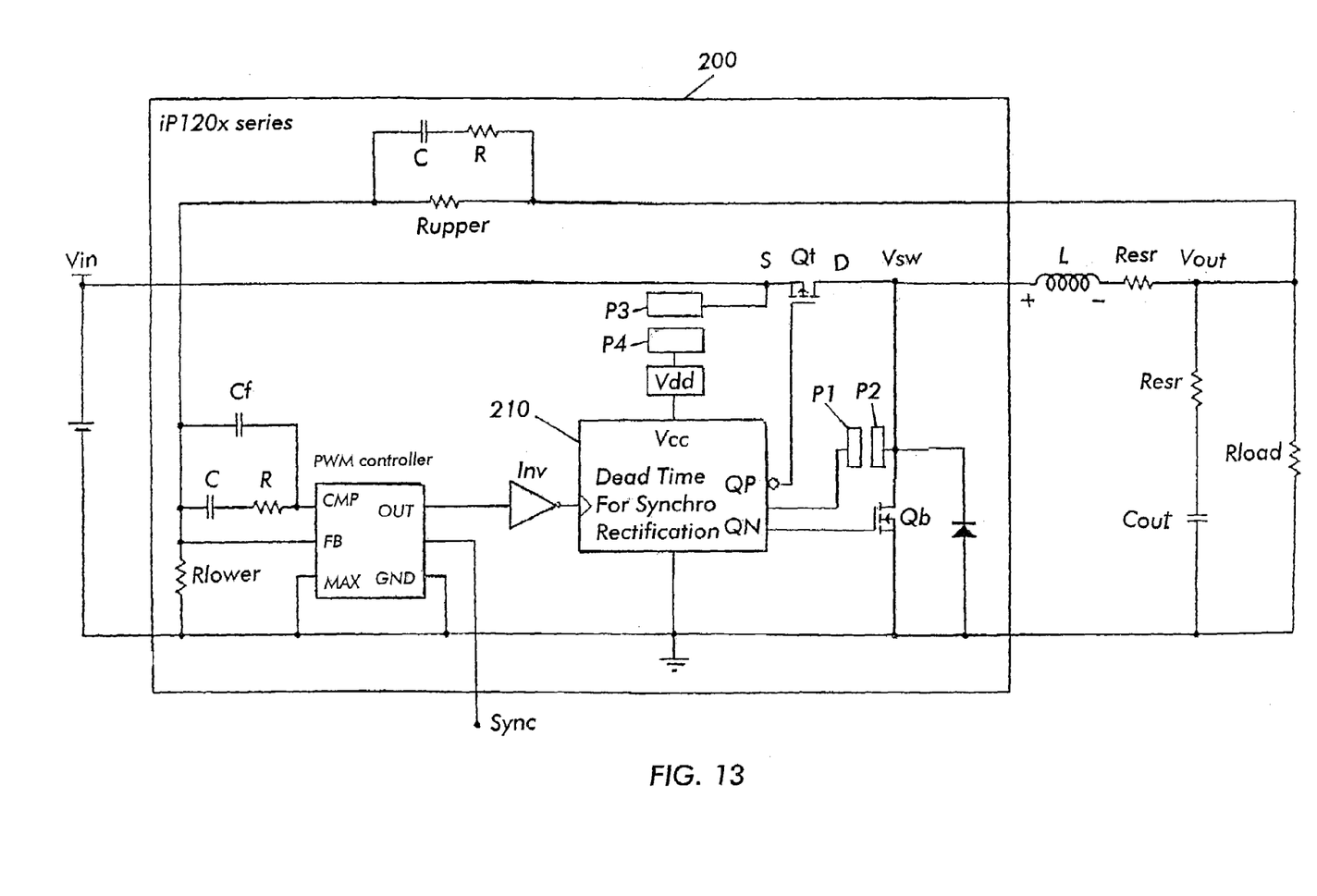
FIG. 13 is a schematic diagram of a DC-DC buck converter according to a third embodiment of the invention.

The fourth issue has been resolved by providing a split connection of the IC input Vdd to the module input Vin, by providing pads P3, P4 (FIG. 2A). The two pads P3, P4 are shown schematically and need not be located at any specific part of the module 200. They are externally accessible. When installed in a complete converter circuit, the pads P3, P4 are connected together, for example by being bridged by a single pad on the circuit board, or by another type of connection. As shown in FIG. 13, in another embodiment of the invention, a pair of pads P1, P2 (described above) may be provided as well.

The fifth issue has been resolved by synchronizing the module switching to the avalanche test. If we set the internal frequency of the IC low enough to have the ON time of the top FET longer than the avalanche test time, then using the Sync pin we can synchronize the switching of the module to the avalanche. Using relays, we are able to test the bottom FET and the top FET with the same avalanche circuitry.

Waveforms illustrating avalanche testing are presented in FIGS. 4-8.

Although the present invention has been described in relation to particular embodiments thereof, many other variations and modifications and other uses will become apparent to those skilled in the art. Therefore, the present invention is not limited by the specific disclosure herein.

What is claimed is:

1. A DC-DC converter module adapted for avalanche testing, comprising:
   an input terminal and a ground terminal;
   an input capacitance connected across said input and ground terminals;
   top and bottom switching devices connected in series across said input and ground terminals;
   a switched output terminal connected to a connection node of said top and bottom switching devices;
   a control IC having respective terminals for receiving power from said input terminal, for receiving a switched output signal from said switched output terminal, and for connecting said top and bottom switching devices;
   said module enclosing said top and bottom switching devices and said control IC;
   at least one pair of pads inside said module, said pads being spaced apart and disconnected from each other, for being bridged by a connector, for selectively connecting said IC to at least one of said input terminal and said switched output terminal.

2. A DC-DC converter module adapted for avalanche testing, comprising:
   an input terminal and a ground terminal;
   an input capacitance connected across said input and ground terminals;
   top and bottom switching devices connected in series across said input and ground terminals;
   a switched output terminal connected to a connection node of said top and bottom switching devices;
   a control IC having respective terminals for receiving power from said input terminal, for receiving a switched output signal from said switched output terminal, and for controlling said top and bottom switching devices;
   said module enclosing said top and bottom switching devices and said control IC and preventng external access thereto;
   at least one pair of pads inside said module, said pads being spaced apart and disconnected from each other and being externally accessible through a portion of said module for being bridged by a connector outside of the module for selectively connecting said IC to at least one of said input terminal and said switched output terminal.

3. The module of claim 2, wherein said selective connecting arrangement includes a respective pair of spaced-apart pads in a corresponding circuit in said module which interconnects said IC with said input terminal.

4. The module of claim 3, wherein said selective connecting arrangement includes a respective pair spaced-apart pads in a corresponding circuit in said module which interconnects said IC with said switched output terminal.

5. The module of claim 2, wherein said selective connecting arrangement includes a respective pair of spaced-apart pads in a corresponding circuit in said module which interconnects said IC with said switched output terminal.

6. An avalanche test circuit for applying an avalanche test signal to a device under test as claimed in claim 2, comprising:
   a series combination of a voltage source and an inductance;
   a switching device connected in parallel with said series combination;
   a diode for being connected to a test terminal of said device under test, said diode being connected to a connection point of said inductance and said switching device;
   a common terminal of said device under test being connected to a connection point of said switching device and said voltage source.

7. The circuit of claim 6, wherein said device under test is a MOSFET, said test terminal being the drain of said MOSFET.

8. The circuit of claim 6, wherein the cathode of said diode is connected to said test terminal and the anode is connected to said connection point of said inductance and said switching device.

9. The circuit of claim 6, wherein said switching device is a MOSFET.

* * * * *